United States Patent
Chen et al.

(10) Patent No.: US 10,379,753 B2
(45) Date of Patent: Aug. 13, 2019

(54) DATA STORAGE DEVICE AND METHOD FOR OPERATING DATA STORAGE DEVICE

(71) Applicant: Silicon Motion, Inc., Jhubei (TW)

(72) Inventors: Ching-Ke Chen, Zhubei (TW); Chin-Fen Tung, Tainan (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 15/936,017

(22) Filed: Mar. 26, 2018

(65) Prior Publication Data

US 2019/0012097 A1   Jan. 10, 2019

(30) Foreign Application Priority Data

Jul. 4, 2017   (TW) .............................. 106122359 A

(51) Int. Cl.
| | |
|---|---|
| *G06F 3/06* | (2006.01) |
| *G11C 8/12* | (2006.01) |
| *G11C 16/22* | (2006.01) |
| *G11C 29/44* | (2006.01) |
| *G11C 29/52* | (2006.01) |

(52) U.S. Cl.
CPC .......... *G06F 3/0614* (2013.01); *G06F 3/0653* (2013.01); *G06F 3/0679* (2013.01); *G11C 8/12* (2013.01); *G11C 16/22* (2013.01); *G11C 29/52* (2013.01); *G11C 2029/4402* (2013.01)

(58) Field of Classification Search
CPC .... G06F 3/0614; G06F 3/0653; G06F 3/0679; G11C 16/22
See application file for complete search history.

(56) References Cited

U.S. PATENT DOCUMENTS

| | | | |
|---|---|---|---|
| 2009/0077305 A1* | 3/2009 | Shin .................... | G06F 13/1668 711/103 |
| 2012/0030416 A1 | 2/2012 | Borchers et al. | |
| 2015/0193159 A1* | 7/2015 | Jo ......................... | G06F 3/0619 711/103 |
| 2015/0363342 A1 | 12/2015 | Tuers et al. | |

FOREIGN PATENT DOCUMENTS

| | | |
|---|---|---|
| TW | 200535608 A | 11/2005 |
| TW | 201227741 A | 7/2012 |

* cited by examiner

*Primary Examiner* — Aracelis Ruiz
(74) *Attorney, Agent, or Firm* — Wang Law Firm, Inc.

(57) ABSTRACT

A non-volatile memory operated through multiple channels. The non-volatile memory includes a plurality of chip-enable-signal controlled areas, each containing a plurality of dies. Simultaneous operations on the different dies of at least one target chip-enable-signal controlled space corresponding to a target channel are allowed. The control unit scans the non-volatile memory to check the health status of the dies of the target chip-enable-signal controlled space to assign a plurality of logical enable signals of the target channel to correspond to the dies of the target chip-enable-signal controlled space.

20 Claims, 5 Drawing Sheets

DATA STORAGE DEVICE AND METHOD FOR OPERATING DATA STORAGE DEVICE

CROSS REFERENCE TO RELATED APPLICATIONS

This Application claims priority of Taiwan Patent Application No. 106122359, filed on Jul. 4, 2017, the entirety of which is incorporated by reference herein.

BACKGROUND OF THE INVENTION

Field of the Invention

The present invention relates to a data storage device, and particularly relates to a multi-channel accessing technology of a data storage device.

Description of the Related Art

There are various forms of non-volatile memory (NVM) used in data storage devices for long-term data retention, such as a flash memory, magnetoresistive RAM, ferroelectric RAM, resistive RAM, spin transfer torque-RAM (STT-RAM), and so on.

A non-volatile memory may be operated through multiple channels. Each channel is shared by several memory spaces for simultaneous operations on the different memory spaces. For example, one channel may be shared by up to N memory spaces, where N is a number. Considering the operational efficiency, the N memory spaces sharing the same channel may be operated alternately in an interleaved way to achieve simultaneous operations on the N memory spaces. The different memory spaces operated in such an interleaved way may be recognized by the logical unit number (LUN) or provided on different dies. Up to N dies can be operated alternately in the interleaved way through the same channel.

FIG. 1 depicts a hierarchical space operated through the same channel. There are two chip-enable-signal controlled areas 102 and 104 sharing the same channel, which are enabled by chip enable signals PhyCE#0 and PhyCE#1, respectively. The chip-enable-signal controlled areas 102 and 104 may be provided on separated chips. The chip-enable-signal controlled area 102 includes four dies Die#0 (corresponding to blocks numbered from 0 to 1023), Die#1 (corresponding to blocks numbered from 1024 to 2047), Die#2 (corresponding to blocks numbered from 2048 to 3071) and Die#3 (corresponding to blocks numbered from 3072 to 4095), designated as logical units LUN#0, LUN#1, LUN#2 and LUN#3 numbered from 0 to 3. Similarly, the chip-enable-signal controlled area 104 includes four dies Die#0 . . . Die#3 designated as logical units LUN#4 . . . LUN#7 numbered from 4 to 7.

Considering the manufacturing defects and the control settings of the chip-enable-signal controlled areas 102 and 104, conventional methods for managing the chip-enable-signal controlled areas 102 and 104 are complex and may fail. FIG. 2 depicts an example wherein some dies malfunction. In the chip-enable-signal controlled area 202, only die Die#1 (corresponding to blocks numbered from 1024 to 2047) and die Die#2 (corresponding to blocks numbered from 2048 to 3071) can work normally. In the chip-enable-signal controlled area 204, only die Die#0 (corresponding to blocks numbered from 0 to 1023) and die Die#2 (corresponding to blocks numbered from 2048 to 3071) can work normally. Such an irregular storage capability renders conventional non-volatile memory control methods infeasible. For example, the malfunctioned die Die#0 may cause a conventional management technique to misjudge the entire chip-enable-signal controlled area 202 as a malfunctioned space, resulting in manufacturing problems of a data storage device.

BRIEF SUMMARY OF THE INVENTION

A data storage device with multi-channel accessing is disclosed. The logical-to-physical mapping managed through each channel is shown.

A data storage device in accordance with an exemplary embodiment of the disclosure includes a non-volatile memory and a control unit. The non-volatile memory includes a plurality of chip-enable-signal controlled areas. Each chip-enable-signal controlled area includes a plurality of dies. The control unit operates the non-volatile memory through multiple channels for simultaneously operating different dies of at least one target chip-enable-signal controlled area corresponding to a target channel. The control unit scans the non-volatile memory to check the health status of the dies of the target chip-enable-signal controlled area to assign a plurality of logical enable signals of the target channel to correspond to the dies of the target chip-enable-signal controlled area.

In an exemplary embodiment, the control unit scans the non-volatile memory to establish a first table. The first table is established to record the health status of the dies of the target chip-enable-signal controlled area. The control unit establishes a second table and a third table by scanning the first table. The second table shows the mapped chip-enable-signal controlled area for each logical enable signal. The third table shows the mapped die within the mapped chip-enable-signal controlled area for each logical enable signal.

The control unit scans the non-volatile memory to establish the first table in a card opening procedure of the data storage device. The control unit receives a target logical enable signal that is issued by a host to operate the non-volatile memory through the target channel. The control unit searches the second table to find the mapped chip-enable-signal controlled area corresponding to the target logical enable signal. The control unit searches the third table to find the mapped die within the mapped chip-enable-signal controlled area corresponding to the target logical enable signal.

In another exemplary embodiment, a method for operating a data storage device is disclosed, which comprises: operating a non-volatile memory of the data storage device through multiple channels for simultaneously operating different dies of at least one target chip-enable-signal controlled area corresponding to a target channel, wherein the non-volatile memory includes a plurality of chip-enable-signal controlled areas, and each chip-enable-signal controlled area includes a plurality of dies; and scanning the non-volatile memory to check the health status of the dies of the target chip-enable-signal controlled area to assign a plurality of logical enable signals of the target channel to correspond to the dies of the target chip-enable-signal controlled area.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

A non-volatile memory may be a memory device for long-term data retention such as a flash memory, a magnetoresistive RAM, a ferroelectric RAM, a resistive RAM, a spin transfer torque-RAM (STT-RAM) and so on. The following discussion is regarding flash memory in particular as an example, but it is not intended to limit the application to the field of flash memory.

The flash memory is often used as a storage medium in today's data storage devices, for implementations of a memory card, a USB flash device, an SSD and so on. In another exemplary embodiment, the flash memory is packaged with a controller to form a multiple-chip package and named eMMC. A data storage device using a flash memory as a storage medium can be applied to a variety of electronic devices, including a smartphone, a wearable device, a tablet computer, a virtual reality device, etc. A central processing unit (CPU) of an electronic device may be regarded as a host operating a data storage device equipped on the electronic device.

Figure 1:
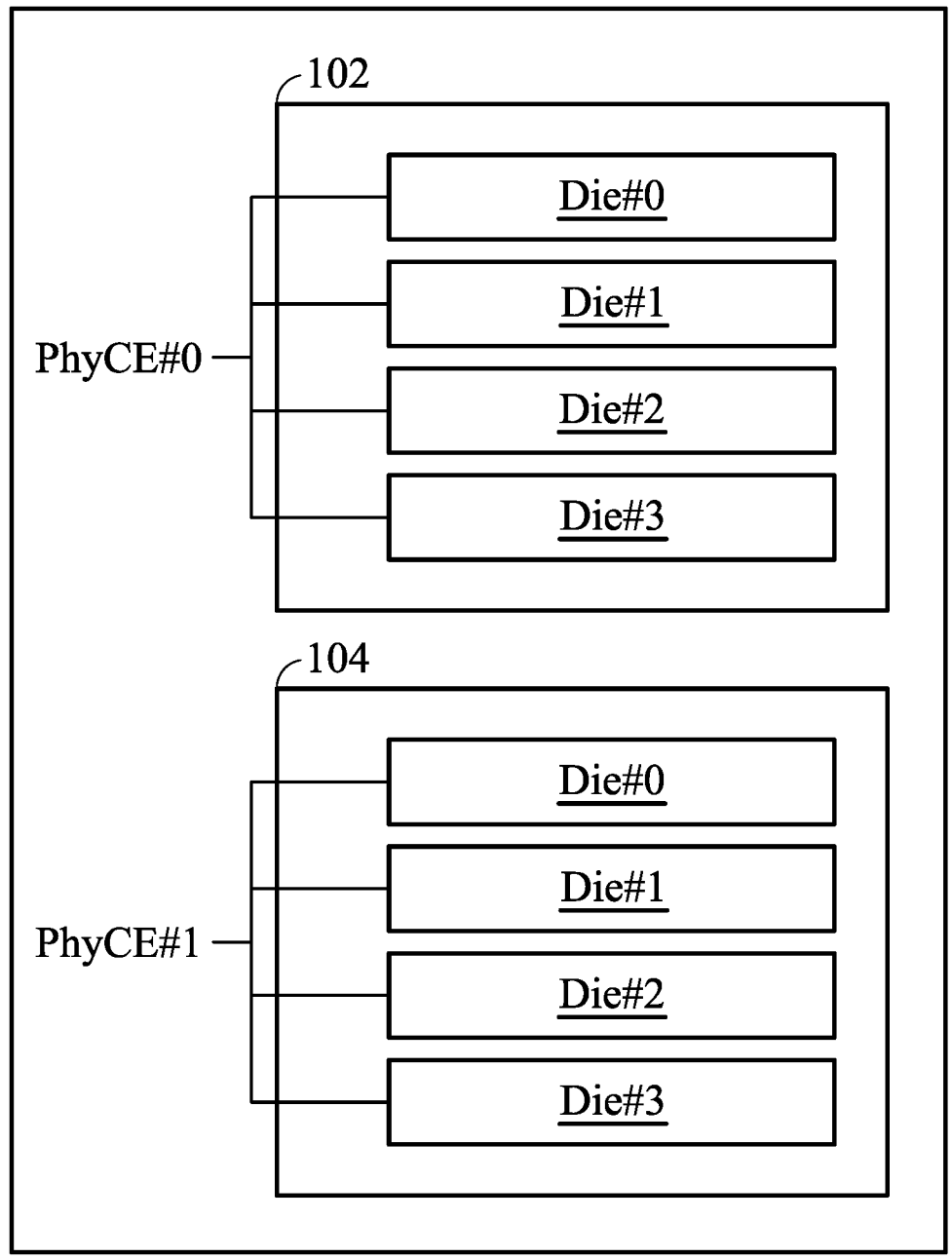
FIG. 1 depicts a hierarchical space operated through the same channel (as shown, each chip-enable-signal controlled area includes dies numbered from low to high)
Figure 2:
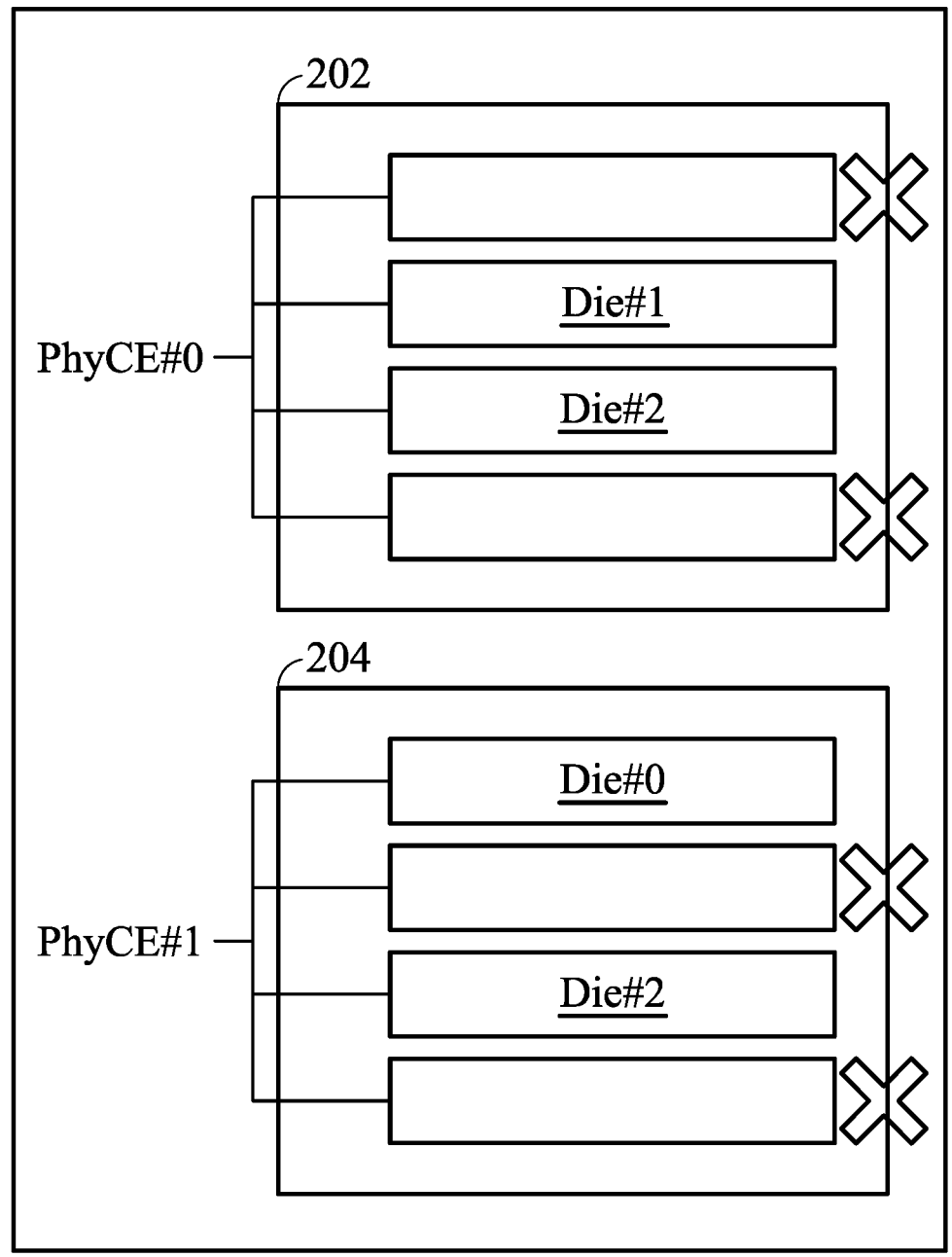
FIG. 2 depicts another hierarchical space operated through the same channel (as shown, each chip-enable-signal controlled area includes dies which are not regularly numbered)
Figure 3:
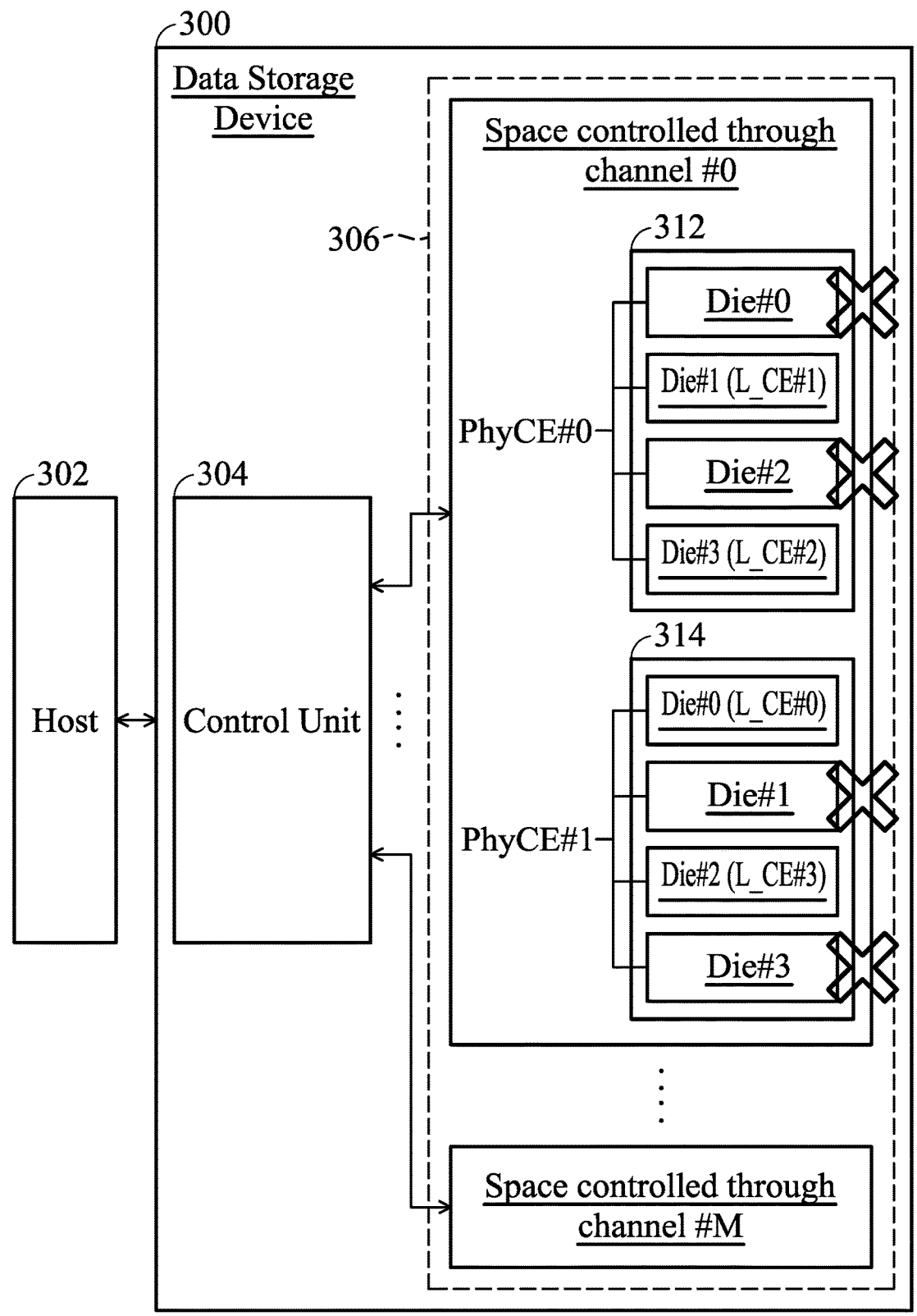
FIG. 3 depicts a data storage device 300 in accordance with an exemplary embodiment of the disclosure; and FIG. 4A

FIG. 3 depicts a data storage device 300 in accordance with an exemplary embodiment of the disclosure, which is coupled to a host 302 and includes a control unit 304 and a flash memory 306. Through the control unit 304, the flash memory 306 can be accessed by the host 302.

The control unit 304 operates the flash memory 306 through multiple channels. As shown, there are M channels, where M is a number. The space accessed through channel #0 is discussed in detail.

Two chip-enable-signal controlled areas 312 and 314 share the same channel (channel #0), and are separately controlled by (physical) chip enable signals PhyCE#0 and PhyCE#1. In another kind of exemplary embodiment, only a chip enable signal PhyCE is used. The A chip enable signal PhyCE and a complementary signal of the chip enable signal PhyCE are provided to enable the chip-enable-signal controlled areas 312 and 314 in a complementary way. The chip-enable-signal controlled areas 312 and 314 may be provided on separated chips or on the same chip. Each of the chip-enable-signal controlled areas 312 and 314 has several dies which are sequentially addressed. As shown, there are four dies Die#0 to Die#3 in the chip-enable-signal controlled area 312, and four dies Die#0 to Die#3 in the chip-enable-signal controlled area 314. When asserting a chip enable signal PhyCE#0/PhyCE#1 (or PhyCE/$\overline{\text{PhyCE}}$), the control unit 304 further uses another kind of signal (e.g. I/O signal) to indicate the target die to be accessed. Therefore, the different dies in the same chip-enable-signal controlled area can be activated individually and thereby can be separately operated to achieve an interleaving-way accessing.

In the example, because of the manufacturing defects and the control settings of the chip-enable-signal controlled areas 312 and 314, the dies Die#0 and Die#2 in the chip-enable-signal controlled area 312 malfunction, and the dies Die#1 and Die#3 in the chip-enable-signal controlled area 314 malfunction. The sequential addressing of the dies of the chip-enable-signal controlled area 312 breaks, and so does the sequential addressing of the dies of the chip-enable-signal controlled area 314. In the chip-enable-signal controlled area 312, only two dies are available. The first available die Die#1 in the chip-enable-signal controlled area 312 (corresponding to the blocks numbered from 1024 to 2047) is designated by a logical unit number LUN#1. Another available die Die#2 in the chip-enable-signal controlled area 312 (corresponding to the blocks numbered from 2048 to 3071) is designated by a logical unit number LUN#2. In the chip-enable-signal controlled area 314, the available dies Die#0 (corresponding to the blocks numbered from 0 to 1023) and Die#2 (corresponding to the blocks numbered from 2048 to 3071) are non-sequentially addressed and are designated by logical unit numbers LUN#0 and LUN#2, respectively. In the disclosure, a non-volatile memory control method to be applied on a data storage device is disclosed to accurately operate the available dies (or logical units) in the chip-enable-signal controlled areas 312 and 314. A card opening procedure of the data storage device 300 may be adapted for implementing the non-volatile memory control method of the disclosure. In the card opening procedure, the available dies within the different chip-enable-signal controlled areas are determined and each available die is mapped to a (logical) enable signal (L_CE). The control unit 304, therefore, can accurately operate the non-volatile memory of the data storage device based on the logical-to-physical mapping.

Figure 4A:
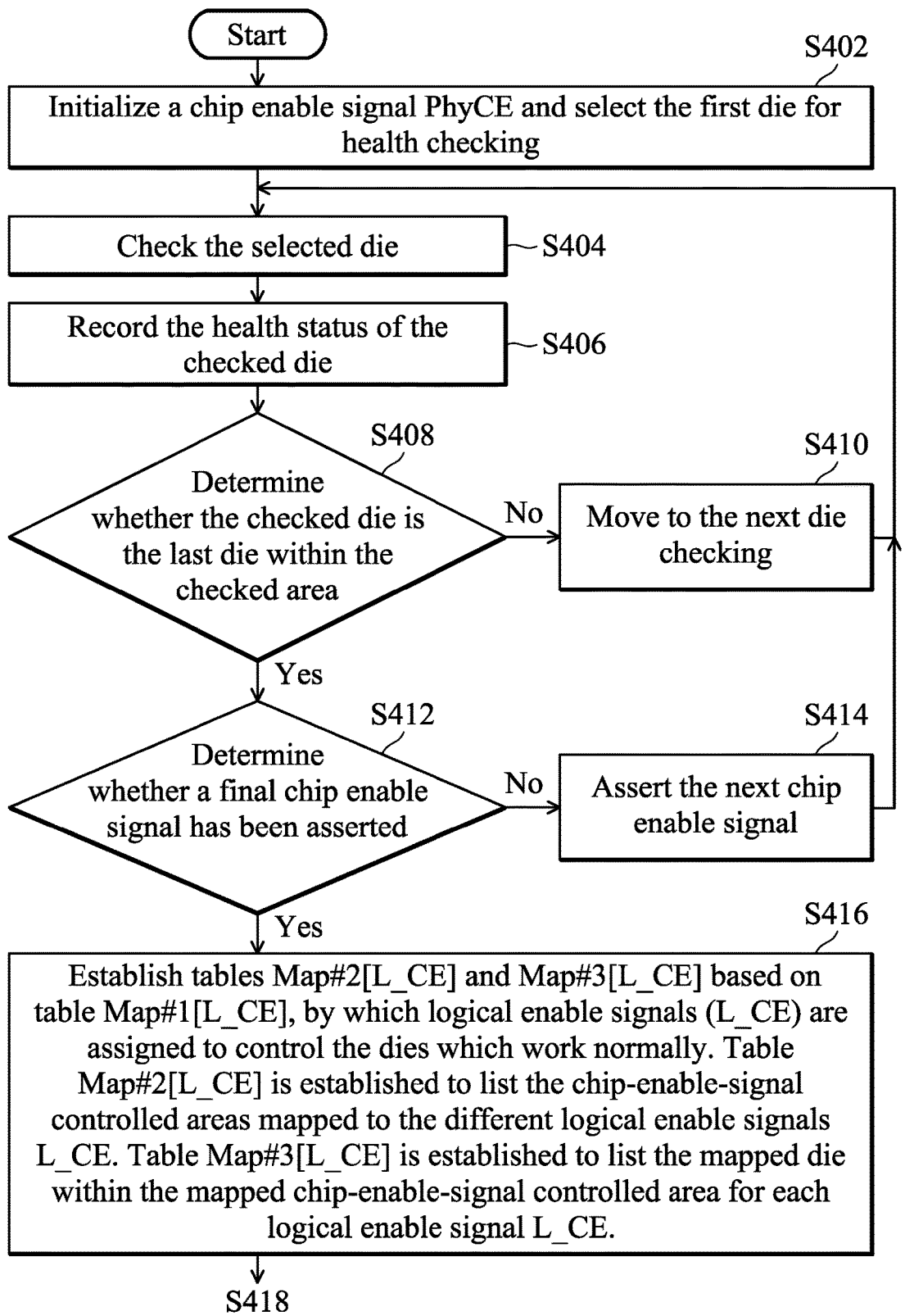
FIG. 4B is a flowchart depicting a non-volatile memory control method for the data storage device 300, which may be performed during a card opening procedure of the data storage device 300.
Figure 4B:
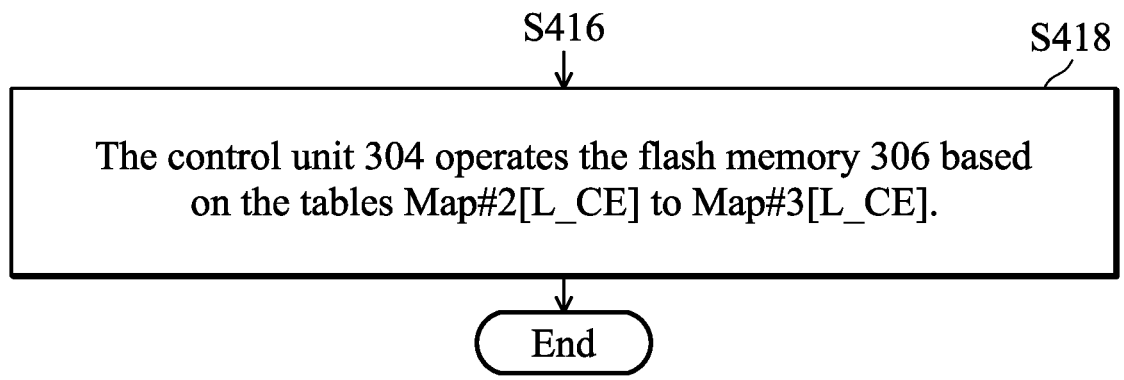

FIG. 4A and FIG. 4B is a flowchart depicting a non-volatile memory control method for the data storage device 300, which may be performed during a card opening procedure of the data storage device 300. Several mapping tables (Map) are generated for operating the non-volatile memory of the data storage device 300. Based on these mapping tables (Map), the control unit 304 accurately and efficiently operates the flash memory 306. When the control procedure for the non-volatile memory starts, step S402 is performed to initialize a chip enable signal PhyCE and select the first die for health checking. Referring to the example depicted in FIG. 3, the data storage device 300 includes chip-enable-signal controlled areas 312 and 314 to be accessed by asserting physical chip enable signals PhyCE#0 and PhyCE#1, respectively. In an exemplary embodiment, the physical chip enable signals PhyCE#0 and PhyCE#1 depend on a chip enable signal PhyCE. The physical chip enable signals PhyCE#0 is asserted by a "high" state of a physical chip enable signal PhyCE. The physical chip enable signals PhyCE#1 is asserted by a "low" state of a physical chip enable signal PhyCE. Each of the chip-enable-signal controlled areas 312 and 314 has four dies Die#0 . . . Die#3. According to step S402, the chip enable signal PhyCE is asserted to enable the access to the chip-enable-signal controlled area 312 and the health checking starts from the first dies Die#0 of the chip-enable-signal controlled area 312.

In step S404, the selected die is checked. For example, to check the first die Die#0 of the chip-enable-signal controlled area 312, the control unit 304 may assert the physical chip enable signal PhyCE#0 to access the die Die#0 of the chip-enable-signal controlled area 312 (e.g., reading page #0 of block #0 of die Die#0 of the chip-enable-signal controlled area 312). When the die Die#0 of the chip-enable-signal controlled area 312 works normally, the chip-enable-signal controlled area 312 enters a "busy" status. When the die Die#0 of the chip-enable-signal controlled area 312 malfunctions, the chip-enable-signal controlled area 312 cannot be correctly switched to the "busy" status. The control unit 304 may monitor a voltage level of a status pin of the flash memory 306 to get the status of the die Die#0 of the chip-enable-signal controlled area 312. In another exemplary embodiment, the control unit 304 automatically transmits a status polling command to the flash memory 306 to get a response from the flash memory 306 to find the status of the die Die#0 of the chip-enable-signal controlled area 312. The health status of the die being checked depends on whether the checked die enters the "busy" status.

In step S406, the health status of the checked die is recorded. For example, a table Map#1[PhyCE][D] is established to record the checking result of each die of each chip-enable-signal controlled area. PhyCE is an index for the different chip-enable-signal controlled areas and D is an index for the different dies of each chip-enable-signal controlled area. For example, when Map#1[0][0] is 1, it means that the first die Die#0 of the first chip-enable-signal controlled area 102 (corresponding to PhyCE#0) works normally. When Map#1[0][0] is 0, it means that the first die Die#0 of the first chip-enable-signal controlled area 102 (corresponding to PhyCE#0) malfunctions.

In step S408, it is determined whether the checked die is the last die within the checked area. If not, step S410 is performed to move to the next die checking. If yes, step S412 is performed. In the exemplary embodiment depicted in FIG. 3, there are four dies in the chip-enable-signal controlled area 312. The checking of the dies in the chip-enable-signal controlled area 312 starts from die Die#0 and steps S404 to S408 are repeated till the checking on the last die Die#0 of the chip-enable-signal controlled area 312 is complete.

In step S412, it is determined whether a final chip enable signal has been asserted. If not, step S414 is performed to assert the next chip enable signal. In the exemplary embodiment depicted in FIG. 3, the chip enable signal PhyCE#0 should be asserted for health checking before the asserting of the chip enable signal PhyCE#1. By step S414, the health checking is switched from the area controlled by the chip enable signal PhyCE#0 to the area controlled by the chip enable signal PhyCE#1. Steps S404 to S410 are repeated till the checking on all dies in the chip-enable-signal controlled area 314 is complete. Step S416 is performed when it is determined in step S412 that the last chip enable signal has been asserted.

By steps S402 to S414, all entries of the table Map#1 [PhyCE][D] are filled with values to show whether the corresponding die is available. For example, when the table Map#1[PhyCE][D] is [0, 1, 0, 1][1, 0, 1, 0], it means there are only four dies that work normally (represented by '1').

In step S416, other tables are established, by which logical enable signals (L_CE) are assigned to control the dies which work normally. The control unit 304 assigns four logical enable signals L_CE#0 to L_CE#3 to control the four normally functioned dies one on one. In an exemplary embodiment, the assignment of the logical enable signals is performed from lower-numbered dies of all target chip-enable-signal controlled areas to higher-numbered dies of all target chip-enable-signal controlled areas. A table Map#2 [L_CE] is established to list the chip-enable-signal controlled areas mapped to the logical enable signals L_CE#0 to L_CE#3. "0" represents the chip-enable-signal controlled area 312 (controlled by the chip enable signal PhyCE#0), and "1" represents the chip-enable-signal controlled area 314 (controlled by the chip enable signal PhyCE#1). Another table Map#3[L_CE] is established to list the mapped die within the mapped chip-enable-signal controlled area for each logical enable signal L_CE#0 to L_CE#3. Referring to the example of FIG. 3, the two tables Map#2 [L_CE] and Map#3[L_CE] are:

Map#2[L_CE]=[1,0,1,0]

Map#3[L_CE]=[0,1,2,3]

To access one of the dies, the control unit 304 indicates the logical information (i.e. the logical enable signal) in the read/write request, and transforms the logical information by looking up the tables Map#2[L_CE] and Map#3[L_CE]. By the table Map#2[L_CE], the controller 304 knows to access which chip-enable-signal controlled area. By the table Map#3[L_CE], the controller 304 knows to access which die within the target chip-enable-signal controlled area.

The logical enable signals L_CE#0 . . . L_CE#3 may be assigned to control the physical space in another way. In an exemplary embodiment, the assignment of the logical enable signals is performed on all dies Die#0 . . . Die#3 of the lower-numbered chip-enable-signal controlled area 312 then on all dies Die#0 . . . Die#3 of the higher-numbered chip-enable-signal controlled area 314. For the same chip-enable-signal controlled area, the assignment of the logical enable signals is performed from the lower-numbered die Die#0 to the higher-numbered die Die#3. Two tables Map#2 [L_CE] to Map#3[L_CE] are also established.

In step S418, the control unit 304 operates the flash memory 306 based on the tables Map#2[L_CE] to Map#3 [L_CE].

In particular, no matter whether the user requests access to the dies by issuing logical information or physical information, the control unit 304 can correctly access the dies based on the established tables Map#1[PhyCE][D], Map#2 [L_CE] and Map#3[L_CE].

The aforementioned discussion about a single channel example can be applied to a multi-channel structure. The healthy status of all dies controlled through the multiple channels of the flash memory 306 is recorded in a table Map#1[CH][PhyCE][D]. "CH" is an index for the multiple channels. As for the assignment of logical enable signals which is performed based on the healthy status recorded in the table Map#1[CH][PhyCE][D], a table, similar to the tables Map#2 and Map#3, may be established for the control unit 304 to map the logical enable signals to the corresponding channel.

The non-volatile memory control method of the disclosure can be applied to a single-channel structure or a multi-channel structure. The number of chip enable signals available to control the space of each channel is not limited. The number of dies within each chip-enable-signal controlled area is not limited.

Other techniques that use the aforementioned concepts to operate a non-volatile memory are within the scope of the disclosure. Based on the above contents, the present invention further relates to methods for operating a non-volatile memory.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a non-volatile memory, including a plurality of chip-enable-signal controlled areas, wherein each chip-enable-signal controlled area includes a plurality of dies; and
   a control unit, operating the non-volatile memory through multiple channels for simultaneously operating different dies of at least one target chip-enable-signal controlled area corresponding to a target channel,
   wherein:
   the control unit scans the non-volatile memory to check the health status of the dies of the at least one target chip-enable-signal controlled area to assign a plurality of logical enable signals of the target channel to correspond to the dies of the at least one target chip-enable-signal controlled area.

2. The data storage device as claimed in claim 1, wherein:
   the control unit scans the non-volatile memory to establish a first table;
   the first table is established to record the health status of the dies of the target chip-enable-signal controlled area;
   the control unit establishes a second table and a third table by scanning the first table;
   the second table shows a mapped chip-enable-signal controlled area for each logical enable signal; and
   the third table shows a mapped die within the mapped chip-enable-signal controlled area for each logical enable signal.

3. The data storage device as claimed in claim 2, wherein:
   the control unit scans the non-volatile memory to establish the first table in a card opening procedure of the data storage device.

4. The data storage device as claimed in claim 3, wherein:
   the control unit receives a target logical enable signal that is issued by a host to operate the non-volatile memory through the target channel; and
   the control unit searches the second table to find the mapped chip-enable-signal controlled area corresponding to the target logical enable signal; and
   the control unit searches the third table to find the mapped die within the mapped chip-enable-signal controlled area corresponding to the target logical enable signal.

5. The data storage device as claimed in claim 2, wherein:
   the control unit scans the first table from lower-numbered dies of all target chip-enable-signal controlled areas to higher-numbered dies of all target chip-enable-signal controlled areas.

6. The data storage device as claimed in claim 2, wherein:
   when finishing the scanning of the first table from a lower-numbered die to a higher-numbered die of a current chip-enable-signal controlled area, the control unit increases an index of the first table to scan a next chip-enable-signal controlled area.

7. The data storage device as claimed in claim 2, wherein:
   the first table is Map#1[CH][PhyCE][D];
   CH is an index for the multiple channels;
   PhyCE is an index for different chip-enable-signal controlled areas corresponding to each channel;
   D is an index for different dies of each chip-enable-signal controlled area;
   a first value is entered into an entry of the first table when the corresponding die works normally; and
   a second value is entered into an entry of the first table when the corresponding die malfunctions.

8. The data storage device as claimed in claim 7, wherein:
   the target channel is numbered as number CHtarget;
   the target channel contains target chip-enable-signal controlled areas numbered from 0 to h; and
   each target chip-enable-signal controlled area contains dies numbered from 0 to k.

9. The data storage device as claimed in claim 8, wherein:
   the control unit repeatedly changes the index PhyCE to scan the first table from Map#1[CHtarget][0][0] to Map#1[CHtarget][h][0], and then Map#1[CHtarget][0][1] to Map#1[CHtarget][h][1], and then Map#1[CHtarget][0][2] to Map#1[CHtarget][h][2] till the scanning of Map#1[CHtarget][0][k] to Map#1[CHtarget][h][k] is performed; and
   when the first value is scanned, the control unit records the number representing the corresponding chip-enable-signal controlled area into the second table and records the number representing the corresponding die into the third table.

10. The data storage device as claimed in claim 8, wherein:
    the control unit repeatedly changes the index D to scan the first table from Map#1[CHtarget][0][0] to Map#1[CHtarget][0][k], and then Map#1[CHtarget][1][0] to Map#1[CHtarget][1][k], and then Map#1[CHtarget][2][0] to Map#1[CHtarget][2][k] till the scanning of Map#1[CHtarget][h][0] to Map#1[CHtarget][h][k] is performed; and
    when the first value is scanned, the control unit records the number representing the corresponding chip-enable-signal controlled area into the second table and records the number representing the corresponding die into the third table.

11. A method for operating a data storage device, comprising:
    operating a non-volatile memory of the data storage device through multiple channels for simultaneously operating different dies of at least one target chip-enable-signal controlled area corresponding to a target channel, wherein the non-volatile memory includes a plurality of chip-enable-signal controlled areas, and each chip-enable-signal controlled area includes a plurality of dies; and
    scanning the non-volatile memory to check the health status of the dies of the at least one target chip-enable-signal controlled area to assign a plurality of logical enable signals of the target channel to correspond to the dies of the at least one target chip-enable-signal controlled area.

12. The method as claimed in claim 11, wherein:
    a first table is established by scanning the non-volatile memory;
    the first table is established to record the health status of the dies of the target chip-enable-signal controlled area;
    the first table is scanned to establish a second table and a third table;
    the second table shows a mapped chip-enable-signal controlled area for each logical enable signal; and
    the third table shows a mapped die within the mapped chip-enable-signal controlled area for each logical enable signal.

13. The method as claimed in claim 12, wherein:
the non-volatile memory is scanned according to a card opening procedure of the data storage device to establish the first table.

14. The method as claimed in claim 13, further comprising:
receiving a target logical enable signal that is issued by a host to operate the non-volatile memory through the target channel; and
searching the second table to find the mapped chip-enable-signal controlled area corresponding to the target logical enable signal; and
searching the third table to find the mapped die within the mapped chip-enable-signal controlled area corresponding to the target logical enable signal.

15. The method as claimed in claim 12, wherein:
the first table is scanned from lower-numbered dies of all target chip-enable-signal controlled areas to higher-numbered dies of all target chip-enable-signal controlled areas.

16. The method as claimed in claim 12, wherein:
when finishing the scanning of the first table from a lower-numbered die to a higher-numbered die of a current chip-enable-signal controlled area, the index of the first table is increased for scanning a next chip-enable-signal controlled area.

17. The method as claimed in claim 12, wherein:
the first table is Map#1[CH][PhyCE][D];
CH is an index for the multiple channels;
PhyCE is an index for different chip-enable-signal controlled areas corresponding to each channel;
D is an index for different dies of each chip-enable signal controlled area;
a first value is entered into an entry of the first table when the corresponding die works normally; and
a second value is entered into an entry of the first table when the corresponding die malfunctions.

18. The method as claimed in claim 17, wherein:
the target channel is numbered as number CHtarget
the target channel contains target chip-enable-signal controlled areas numbered from 0 to h; and
each target chip-enable-signal controlled area contains dies numbered from 0 to k.

19. The method as claimed in claim 18, wherein:
the index PhyCE is repeatedly changed for scanning the first table from Map#1[CHtarget][0][0] to Map#1[CHtarget][h][0], and then Map#1[CHtarget][0][1] to Map#1[CHtarget][h][1], and then Map#1[CHtarget][0][2] to Map#1[CHtarget][h][2] till the scanning of Map#1[CHtarget][0][k] to Map#1[CHtarget][h][k] is performed; and
when the first value is scanned, the number representing the corresponding chip-enable-signal controlled area is recorded into the second table and the number representing the corresponding die is recorded into the third table.

20. The method as claimed in claim 18, wherein:
the index D is repeatedly changed for scanning the first table from Map#1[CHtarget][0][0] to Map#1[CHtarget][0][k], and then Map#1[CHtarget][1][0] to Map#1[CHtarget][1][k], and then Map#1[CHtarget][2][0] to Map#1[CHtarget][2][k] till the scanning of Map#1[CHtarget][h][0] to Map#1[CHtarget][h][k] is performed; and
when the first value is scanned, the number representing the corresponding chip-enable-signal controlled area is recorded into the second table and the number representing the corresponding die is recorded into the third table.

\* \* \* \* \*